Figure 2:
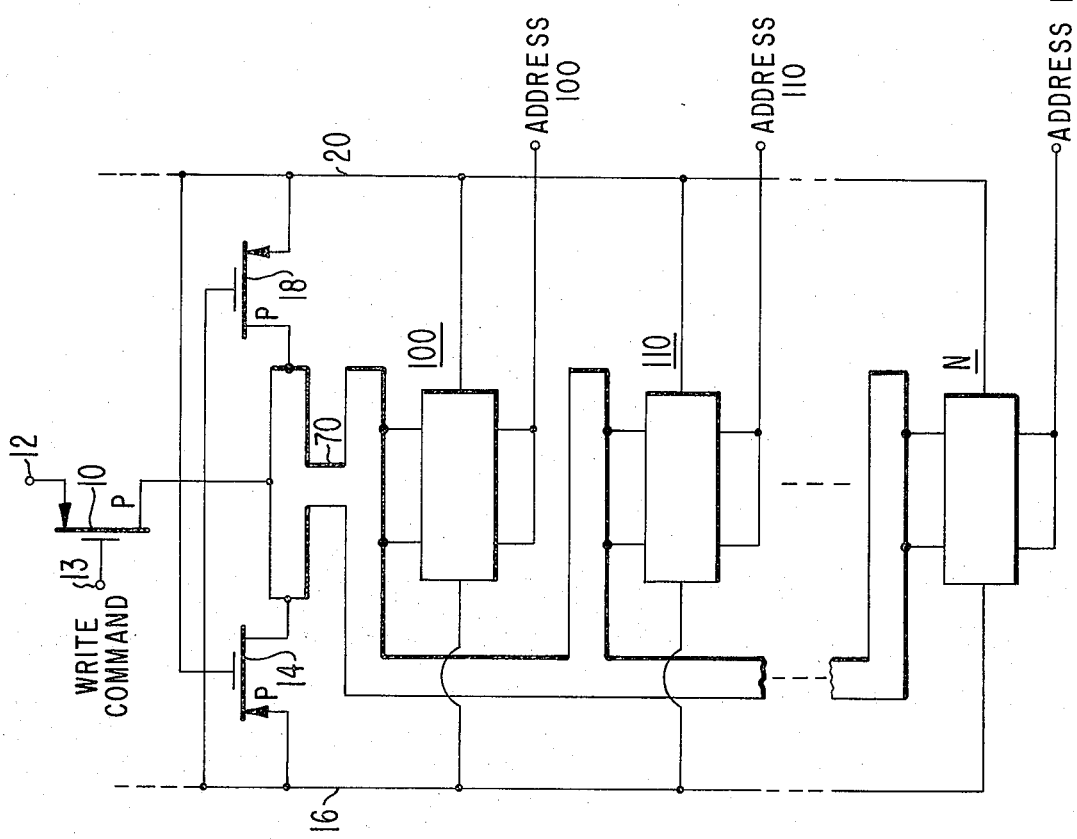

United States Patent
Dingwall

[11] 3,971,004
[45] July 20, 1976

[54] MEMORY CELL WITH DECOUPLED SUPPLY VOLTAGE WHILE WRITING

[75] Inventor: Andrew Gordon Francis Dingwall, Somerville, N.J.

[73] Assignee: RCA Corporation, New York, N.Y.

[22] Filed: Mar. 13, 1975

[21] Appl. No.: 558,145

[52] U.S. Cl. .................... 340/173 FF; 340/173 R
[51] Int. Cl.² .................. G11C 7/00; G11C 11/42
[58] Field of Search ............... 340/173 FF, 173 R; 307/291, 279

[56] References Cited
UNITED STATES PATENTS
3,879,621  4/1975  Cavaliere et al. ............ 340/173 FF OTHER PUBLICATIONS
Moore et al., Monolithic Memory Restore Circuit Pair, IBM Technical Disclosure Bulletin, vol. 14, No. 6, 11/71, S27170019, pp. 1687–1688.

Primary Examiner—Stuart N. Hecker
Attorney, Agent, or Firm—H. Christoffersen; S. Cohen; F. R. Perillo

[57] ABSTRACT

A semiconductor memory cell whose supply voltage is decoupled from the cell voltage bus during a write operation. Automatic return of the bus to the supply voltage level once the static state is reached, even though a write command is still present, is achieved by supplying operating voltage to the cell bus from one of the data lines via a conducting transistor.

12 Claims, 2 Drawing Figures

MEMORY CELL WITH DECOUPLED SUPPLY VOLTAGE WHILE WRITING

Memory cells realized with bistable multivibrators (flip-flops) such as those formed of metal-oxide-semiconductor (MOS) or complementary metal-oxide-semiconductor (CMOS) devices are well-known. Such cells may employ, for example, 5 or 6 or more transistors per cell.

A particular five transistor memory cell of the type above includes two cross-coupled inverter circuits, each inverter having two transistors. In addition, a fifth transistor, which may be used either to sense (read) the state of the cell or to introduce (write) new information into the cell, is connected between the input of one of the inverters and a data or sense line. This latter transistor is defined herein as a transmission device. The cell may be modified by connecting a sixth transistor, a second transmission device, between the input of the other inverter and a data or sense line, this line generally being different from the line connected to the fifth transistor.

When the same transmission device is used for both the read and write functions, a problem arises. If the impedance of the transmission device in its on mode is low enough to allow the cell to rapidly change its state and thereby its information content during the write operation, then the same device also may cause the cell to change its state at undesired times. For example, during the read mode, when it is desired to sense the information content of the cell in a non-destructive manner, a transient voltage or residual charge present on the sense line may cause the cell to change its state, destroying the information contained therein.

Many techniques have been developed in the prior art for minimizing the above problem. The technique of precharging the sense line to a voltage that will not cause the cell to change its state when the transmission device or devices are turned on is well-known.

Another approach is to design the cell so that at normal system voltages, because of the relative geometries of the devices used, the impedance of the transmission device on its on condition is too high to permit the cell to change its state. This makes it possible to safely read out the cell in a non-destructive manner. When it is desired to write information into the cell, the system operating voltage is modified in one of a number of ways, typical ones of which are described below.

In the technique described by Gricchi et al. in U.S. Pat. No. 3,644,907, the cell power supply is reduced to a level at which the cell becomes "inoperative" when a write operation is to be performed. Information is then supplied to the cell and it momentarily is stored therein by parasitic capacitances associated with the MOS devices. The cell power is then restored and charge retained in the capacitances causes the cell to be set to the desired state.

In Smith et al., U.S. Pat. No. 3,813,653, the cell supply voltage is reduced to a value sufficiently high to enable the cell to remain in a static mode of operation prior to the application of write information. At this reduced level, the transmission device is able to supply (or sink) enough current to permit the cell to change its state. In both of the above-references, cells whose state it had been difficult to change at full operating voltage, had this voltage reduced at the start of a write period then increased at the completion.

Normal system operation is not achieved in either of the above references until full cell voltage is restored. A timing requirement thus exists for restoring full voltage as soon as possible after the desired information has been supplied to the cell.

Figure 1:
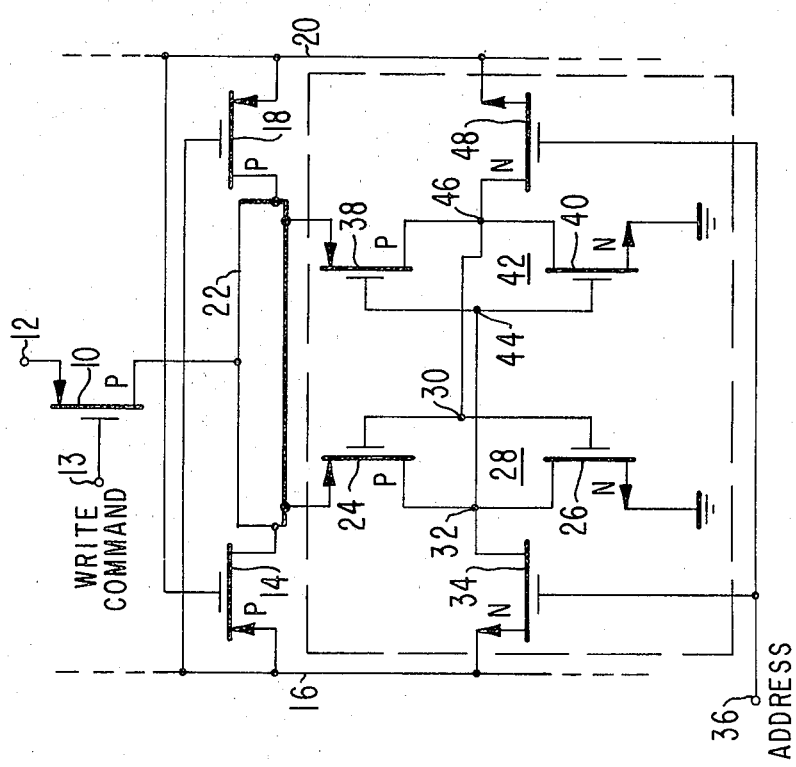

In the drawing:

FIG. 1 is a schematic circuit diagram of a preferred embodiment of the invention; and FIG. 2 is a partial block diagram of a memory array utilizing the invention.

In FIG. 1, the source electrode of P/MOS transistor 10 is connected to terminal 12, which in turn connects to a voltage source (not shown). The gate electrode of transistor 10 connects through terminal 13 to a source of write commands (not shown). The source electrodes of P/MOS transistors 14 and 18 are connected to data (digit) lines 16 and 20, respectively. The drain electrodes of transistors 10, 14 and 18 are connected to memory cell bus 22. P/MOS transistor 24 and N/MOS transistor 26 comprise C/MOS inverter 28 which has an input node 30 and an output node 32. The drain-source path of N/MOS transistor 34 connects between data line 16 and inverter output node 32 while its gate electrode connects through terminal 36 to a source of address commands (not shown).

P/MOS transistor 38 and N/MOS transistor 40 comprise a second C/MOS inverter 42 which has an input node 44 and an output node 46. Inverters 28 and 42 are connected between bus 22 and a reference potential, the latter potential shown as ground. The drain-source path of N/MOS transistor 48 connects between node 46 and data line 20 while its gate electrode connects to terminal 36. Inverters 28 and 42 are cross-coupled. The output node 46 of inverter 42 is coupled to input node 30 of inverter 28. In a similar manner, output node 32 of inverter 28 is connected to input node 44 of inverter 42.

In the above-circuit description and in the explanation which follows, it should be remembered that an MOS transistor is a bilateral device capable of conducting current in either direction depending upon the polarity of the applied voltages. Thus, a given electrode may be considered a source or a drain terminal. Particular designations are assigned to each electrode herein as a convenience in describing circuit operation.

In the operation of the memory cell circuit of FIG. 1, the data signals applied to data lines 16 and 20 are the logical complements of each other. The logical complement of the write command applied to terminal 13 is the read command. Thus, whenever the memory cell of FIG. 1 is not in the write mode of operation, it is in the read mode. Assume initially that the cell is in the read mode. In this mode, a relatively low, zero or negative voltage is applied to terminal 13. For purposes of discussion, this voltage will be referred to as a zero volt signal. Further assume that the data signal present on line 20 is at a level of +V, herein defined as a logical one. This voltage level is also the value of the supply voltage applied to terminal 12. Data line 16 is at a level corresponding to a binary zero and this level is defined herein as zero volts. With no address command applied to terminal 36, transistors 34 and 48 are off.

For the above-described conditions, transistors 10 and 18 are on while transistor 14 is off. For the same conditions, assume that the information contained on the data lines has already been stored by the memory cell. The output node of inverter 42 is high meaning that point 46 is essentially at the power supply potential +V, while the output node 32 of inverter 28 is essentially at ground potential. Inverter transistors 38 and 26 are conducting while transistors 24 and 40 are off. It is a characteristic of inverter circuits realized with C/MOS transistors that the current within the inverter is essentially zero when the inverter is in a static state and is not coupled to an external load.

If it is desired to determine the information content of the cell, the voltages present on the data lines are removed. An address command, which is a positive signal, of value +V for the present example, turns transistors 34 and 48 on. The voltage present at the output nodes of each inverter is coupled to the data lines. Sensing circuits (not shown) connected to the data lines then determine the state of the cell. For the present example, the cell is defined to be storing a binary one.

The cell of FIG. 1 is designed to be normally "unflippable." This means that transistors 34 and 48 have a relatively high source-to-drain impedance, so high that insufficient current can flow through these paths, from or to the cell, to cause the cell to change its state. The cell is thus protected from an erroneous change of state that could be caused, for example, by a residual voltage present on the data lines. This voltage could, if the cell were not unflippable, cause it to change its information content by causing a current to flow between either data line and the cell. Such a residual voltage can be caused, in some cases, by an accumulation of charge on the stray capacitance associated with the data lines.

Assume that the cell is storing a binary one and it is desired to change the state of the cell. Initially, no write command is applied to terminal 13. Data line 20 is switched to zero potential while data line 16 is switched to +V volts. An address command turns on transistors 34 and 48. Because the cell is normally unflippable, the cell will not change its state even though there is a relatively large potential difference between each inverter output node and its associated data line. Transistor 14 is turned on and transistor 18 is turned off by the data line voltages.

To repeat, at this instant, node 46 is at +V and is coupled to data line 20, which is at zero volts, by conducting transistor 48. Because of its impedance, transistor 48 cannot "sink" enough current from the cell to cause it to change state. At the same time, node 32 is at zero volts and is coupled to the data line 16, which is at +V volts, by transistor 34. Transistor 34 cannot supply enough current to the cell to cause it to change state.

A write command is now applied to transistor 10. This is a positive signal which turns off 10, thereby decoupling the cell from the supply voltage present at terminal 12. While conducting transistor 14 does couple bus 22 to line 16, and line 16 is at +V volts, the impedance of the source-drain path of transistor 14 is relatively high. Therefore, when transistor 10 cuts off, transistor 14 initially tends to place the bus at a voltage level which is a function of its impedance compared to the total impedance from line 16 through transistor 14 to bus 22 to ground. The impedance from bus 22 via conducting transistor 38 and conducting transistor 48 to ground is much, much lower than the impedance of transistor 14. Therefore, the voltage at bus 22 tends to go to a value close to ground level. However, bus 22 cannot reach this level instantaneously because there is stray capacitance present. Rather the decay, towards zero volts, is gradual.

As the bus voltage decreases, the voltage applied by conducting transistor 38 to nodes 46 and 30 decreases correspondingly. The decrease in the voltage at node 30 tends to turn transistor 26 off and transistor 24 on.

At the same time, conducting transistor 34 tends to raise the potential at nodes 32 and 44 toward +V, the potential on line 16. This increasing voltage tends to turn off transistor 38 and turn on transistor 40. This further reduces the potential at node 46, which further tends to drive transistor 26 to cutoff and transistor 24 into conduction. The regenerative action continues until the cell voltage conditions are such that the limited current flowing through transistors 34 and 48 will cause the cell to change its state.

At this time, full voltage automatically is restored to the cell by transistor 14 which couples the +V voltage present on data line 16 to bus 22. As already mentioned, under dynamic conditions, that is, while current flows through a path comprising transistor 14, a conducting transistor of the memory cell and one of 48 or 34, the relative impedance of transistor 14 is such that it cannot place bus 22 at +V. (The impedance of transistor 14, and of transistor 18, is a function of the physical size of these devices. A high impedance may be achieved by fabricating transistors 14 and 18 such that the device length/width (L/W) ratio of these devices is greater than the L/W ratios of the four inverter transistors and transistors 34 and 48.) However, as soon as the cell has switched state so that no current flows through the cell and one of transistors 48 and 34, the impedance from bus 22 to ground becomes very high —much higher than that across the conduction path of transistor 14. This latter transistor then places the bus at the data line 16 potential of +V.

This restoration of full supply voltage immediately upon completion of the write cycle is an essential feature of the subject invention. The voltage is restored automatically once the information is stored by the cell even though the write command may still be present at terminal 13. The cell receives voltage even though bus 22 may still be decoupled from the supply voltage applied to terminal 12. This feature removes critical timing restrictions on the write command. The only restriction is that the write signal be long enough to allow a write cycle to occur. Any pulse length in excess of this minimum value will not interfere with recovery of the cell to a normal static state.

The above-described technique may result in lower overall power consumption for the cell. Power is drawn by the cell only during the period when it is changing its state. Some prior art circuits that also reduce the cell supply voltage for a write operation utilize means that consume power while the cell voltage is reduced. For such circuits, it is imperative that the cell voltage be restored as soon as possible after the write cycle is complete. This requirement is not present in this invention.

Operation of the circuit of FIG. 1 when it is desired to store a binary one signal, is similar to the operation discussed above except that transistor 14 is off at this time and transistor 18 performs the function of coupling bus 22 to the data line potential.

The extension of the above-described invention to a memory array is shown in FIG. 2. Elements common to FIGS. 1 and 2 have been given like reference designations. Transistor 10 connects via terminal 12 to a voltage source (not shown). The gate electrodes of transistors 14 and 18 are connected to data lines 20 and 16, respectively. Data line 16 is coupled to system bus 70 by the drain-source path of transistor 14. The bus is coupled to data line 20 by the drain-source path of transistor 18. Circuits 100, 110 . . . N each comprise a six transistor memory cell for a total of N cells. Each cell is identical to the portion of FIG. 1 shown within the dashed lines. In addition, each of the N cells is connected to the bus and data lines in a manner identical to that shown in FIG. 1. The N cells are each connected to a source of address commands (not shown). These commands are applied to each cell at a point identified as terminal 36 of FIG. 1.

The circuit of FIG. 2 is a partial representation of an N cell column memory array. A write command applied to terminal 13 will decouple the power supply from all cells in the array. Bus 70 has a function similar to the bus 22 of FIG. 1 except that the former element is shared by all N cells. When it is desired to write information in a particular cell, this cell is addressed. A write command is applied to terminal 13 decoupling all cells in the column from the power supply bus. The information contained on the data lines is only transferred to the cell that had been addressed. The (N-1) remaining normally unflippable cells remain in the state assumed prior to the start of the write operation.

If the memory array contained M columns, the circuit of FIG. 2 would be used M times, once for each column in the array.

What is claimed is:

1. Memory means comprising, in combination:
   a supply voltage bus;
   first and second digit lines;
   a memory cell connected between said bus and a point of reference potential and exhibiting a high impedance between these points under static conditions, said cell including a low impedance path between the bus and a first node of the cell when in one state and a low impedance path between the bus and a second node of the cell when in its second state;
   first and second switches, the first between the first digit line and the first node and the second between the second digit line and the second node, the switches, when conducting, exhibiting a substantially higher impedance than the low impedance paths of the cell;
   a third normally closed switch connecting said bus to a terminal for a supply voltage;
   a fourth normally open switch connected between said bus and a point at the supply voltage level, said fourth switch, when conducting, exhibiting an impedance which is substantially higher than that of the first or second switches and substantially lower than said cell high impedance; and
   means for executing a write operation when one of said digit lines is placed at said reference potential and the other is placed at the supply voltage level comprising:
   means for opening said third switch; and
   means for closing said first, second and fourth switches.

2. The combination of claim 1 where said memory cell comprises first and second inverters, the output node of said first inverter connected to the input node of said second inverter forming said first node thereby and the output node of said second inverter connected to the input node of said first inverter forming said second node thereby.

3. The combination of claim 1 where said first and second switches comprise first and second MOS transistors, each having a gate electrode and a drain-source path, said drain-source path exhibiting said substantially higher impedance, the first transistor drain-source path connected between said first digit line an said first node and the second transistor drain-source path connected between said second digit line and said second node.

4. The combination of claim 3 where said third switch comprises a third MOS transistor having a gate electrode and a drain-source path, said drain-source path connected between said bus and said terminal.

5. The combination of claim 4 where said fourth switch comprises a fourth MOS transistor having a gate electrode and a drain-source path, said drain-source path connected between said bus and said point, said path exhibiting an impedance substantially higher than that of said first or second switches and substantially lower than said cell high impedance.

6. The combination of claim 5 where means for opening said third switch comprises a voltage applied to the gate electrode of said third MOS transistor thereby rendering said device nonconducting.

7. The combination of claim 5 where said means for closing said first, second and fourth switches comprises a voltage coupled to the respective gate electrodes of each of said first, second and fourth MOS transistors thereby rendering each transistor conducting.

8. Memory means having read and write modes comprising, in combination:
   a terminal for a voltage at a given level;
   a bus;
   switch means connected between said bus and said terminal for connecting said bus to said terminal during said read mode;
   a memory cell having first and second states connected between said bus and a point of reference potential, said cell, when in said first state, exhibiting a low impedance between said bus and a first node of the cell and when in said second state, exhibiting a high impedance between said bus and node;
   means for writing information into said cell thereby switching the cell from its first to its second state comprising means for connecting said first node through a first path having an impedance which is much higher than said low impedance and much lower than said high impedance to said point of reference potential and means for concurrently opening said switch means, whereby the voltage on said bus drops towards the reference potential level, said cell switching to said second state when the voltage on said bus reduces to a particular value; and
   means for automatically supplying a voltage having a given level to said bus after the cell has switched state comprising a path between said bus and a point at a given voltage level, said path having an impedance which is much higher than that of said first path and which is much lower than the impedance of said cell between said bus and said point of reference potential when said cell has assumed either said first or said second state.

9. The combination of claim 8 where said cell comprises:
   first and second CMOS transistors, each transistor having a drain-source path and a gate electrode, said drain-source paths serially connected between said bus and said point of reference potential, the node at the connection between said two paths comprising said first node of said cell, and said gate electrodes connected together; and third and fourth CMOS transistors, each transistor having a drain-source path and a gate electrode, said drain-source paths of said third and fourth transistors serially connected between said bus and said point of reference potential, the node at the connection of the paths of said third and fourth transistors comprising a second node of said cell, said second node connected to the gate electrodes of said first and second transistors and the gate electrodes of said third and fourth transistors connected together and to said first node.

10. The combination of claim 9 where said means for switching the cell comprises a fifth MOS transistor having a drain-source path and a gate electrode, said path coupled between said node and said point of reference potential whenever a voltage of suitable amplitude is applied to said gate electrode thereby rendering said transistor conductive.

11. The combination of claim 8 where said switch means comprises a MOS transistor having a drain-source path and a gate electrode, said path coupled between the bus and the terminal, and said means for opening said switch means comprising means for applying a voltage of sufficient amplitude to said gate electrode for rendering said transistor nonconducting.

12. The combination of claim 11 where said means for automatically supplying a voltage having a given level comprises an additional MOS transistor having a drain-source path and a gate electrode, said path coupled between said bus and a point at said given level, whereby said given level is applied to said bus whenever a turn on voltage is applied to said gate electrode.

* * * * *